(12) United States Patent
Khan et al.

(10) Patent No.: US 9,494,657 B2
(45) Date of Patent: Nov. 15, 2016

(54) STATE OF HEALTH ESTIMATION OF POWER CONVERTERS

(71) Applicant: The University of Utah Research Foundation, Salt Lake City, UT (US)

(72) Inventors: Faisal Khan, Salt Lake City, UT (US); Most. Sultana Nasrin, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 108 days.

(21) Appl. No.: 13/653,085

(22) Filed: Oct. 16, 2012

(65) Prior Publication Data

US 2014/0103937 A1    Apr. 17, 2014

(51) Int. Cl.
*G01R 31/40* (2014.01)
*G01R 31/28* (2006.01)
(Continued)

(52) U.S. Cl.
CPC .......... *G01R 31/40* (2013.01); *G01R 31/2608* (2013.01); *G01R 31/2839* (2013.01);
(Continued)

(58) Field of Classification Search
CPC ...... G01R 31/26; G01R 31/28; G01R 31/40; G01R 31/2843; G01R 31/2621; G01R 31/2608; G01R 31/87; G08B 21/00; G06F 11/30; G01M 19/00
USPC .............. 324/509, 537, 548, 762.08, 762.09, 324/764.01; 327/107; 702/182
See application file for complete search history.

(56) References Cited

U.S. PATENT DOCUMENTS 6,291,987 B1 * 9/2001 Dean et al. ............... 324/764.01
6,519,538 B1 * 2/2003 Bowman ................. H02M 3/00
324/176

(Continued)

FOREIGN PATENT DOCUMENTS

FR            2931323 A1 * 11/2009
KR    10-2009-0023051 A     3/2009
(Continued)

OTHER PUBLICATIONS

M. S, Nasrin, "Use of Spread Spectrum Time Domain Reflectometry to Estimate State of Health of Power Converters," in 2012 IEEE 13th Workshop on Control and Modeling for Power Electronics, © IEEE, doi: 10.1109/COMPEL.2012.6251790.*
(Continued)

*Primary Examiner* — Melissa Koval
*Assistant Examiner* — Felicia Farrow
(74) *Attorney, Agent, or Firm* — Michael Best & Friedrich LLP

(57) ABSTRACT

Systems, methods and devices which utilize Spread Spectrum Time Domain Reflectometry (SSTDR) techniques to measure degradation of electronic components are provided. Such measurements may be implemented while the components "live" or otherwise functioning within an overall system. In one embodiment, monitoring a power converter in a high power system is accomplished. In this embodiment, degradation of components within the power converter (e.g. metal-oxide-semiconductor field-effect transistors (MOSFETs), capacitors, insulated-gate bipolar transistors (IGBTs), and the like) may be monitored by processing data from reflections of an SSTDR signal to determine changes in impedance, capacitance, or any other changes that may be characteristic of components degrading. For example, an aging MOSFET may experience an increase of drain to source resistance which adds additional resistance to a current path within a power converter. Such a change is able to be analyzed monitored upon processing the reflected test signals.

21 Claims, 8 Drawing Sheets

(51) Int. Cl.

| | | |
|---|---|---|
| *G01R 31/26* | (2014.01) | |
| *G01R 31/327* | (2006.01) | |
| *G01R 31/00* | (2006.01) | |
| *G01R 31/06* | (2006.01) | |

(52) U.S. Cl.
CPC ......... *G01R31/2843* (2013.01); *G01R 31/007* (2013.01); *G01R 31/06* (2013.01); *G01R 31/2621* (2013.01); *G01R 31/327* (2013.01)

(56) References Cited

U.S. PATENT DOCUMENTS

| | | | | |
|---|---|---|---|---|
| 7,250,772 | B2* | 7/2007 | Furse et al. .................. | 324/534 |
| 7,768,292 | B1* | 8/2010 | Koch ..................... | G01R 31/40 |
| | | | | 324/764.01 |
| 7,817,051 | B2* | 10/2010 | Cheng et al. ................ | 340/635 |
| 7,830,269 | B2* | 11/2010 | Cheng et al. ................ | 340/635 |
| 8,090,548 | B2* | 1/2012 | Abdennadher et al. ...... | 324/537 |
| 8,359,177 | B2* | 1/2013 | Lelong .................... | H04B 3/46 |
| | | | | 702/66 |
| 8,688,395 | B2* | 4/2014 | Mori ............................ | 324/601 |
| 8,711,711 | B2* | 4/2014 | Kim .............................. | 370/242 |
| 2006/0012376 | A1 | 1/2006 | Furse et al. | |
| 2007/0150236 | A1 | 6/2007 | Warizaya | |
| 2008/0285184 | A1 | 11/2008 | Phadke et al. | |
| 2010/0125435 | A1 | 5/2010 | Pong et al. | |
| 2011/0181292 | A1* | 7/2011 | Oowada ........................ | 324/537 |
| 2011/0181295 | A1* | 7/2011 | Haugen .............. | G01R 31/1272 |
| | | | | 324/543 |
| 2011/0227582 | A1* | 9/2011 | Ahamed et al. .............. | 324/533 |
| 2011/0313691 | A1* | 12/2011 | Dobson et al. ................. | 702/58 |
| 2011/0316559 | A1* | 12/2011 | Haffner et al. ............... | 324/612 |
| 2012/0086458 | A1* | 4/2012 | Wei et al. ..................... | 324/509 |
| 2012/0169360 | A1* | 7/2012 | Andris .................... | E02F 9/267 |
| | | | | 324/750.01 |
| 2012/0182038 | A1 | 7/2012 | Marzetta et al. | |
| 2012/0235687 | A1* | 9/2012 | Abe et al. ..................... | 324/537 |
| 2012/0268153 | A1* | 10/2012 | Nickel ............... | G01R 31/3025 |
| | | | | 324/754.31 |
| 2013/0158932 | A1* | 6/2013 | Witter et al. .................. | 702/108 |
| 2013/0282313 | A1* | 10/2013 | Wank et al. .................... | 702/58 |

FOREIGN PATENT DOCUMENTS

| | | |
|---|---|---|
| WO | WO 2005109020 A2 * | 11/2005 |
| WO | WO-/2012/082648 A1 | 6/2012 |

OTHER PUBLICATIONS

P. Smith et al, "Analysis of Spread Spectrum Time Domain Reflectometry for Wire Fault Location." IEEE Sensors Journal, vol. 5, No. 6, pp. 1469-1478, Dec. 2005.*

International Search Report and Written Opinion issued for PCT/US2013/064440, dated Jan. 22, 2014, 9 pages.

Extended European Search Report for Application No. 13847078.6 dated Jun. 30, 2016 (10 pages).

* cited by examiner

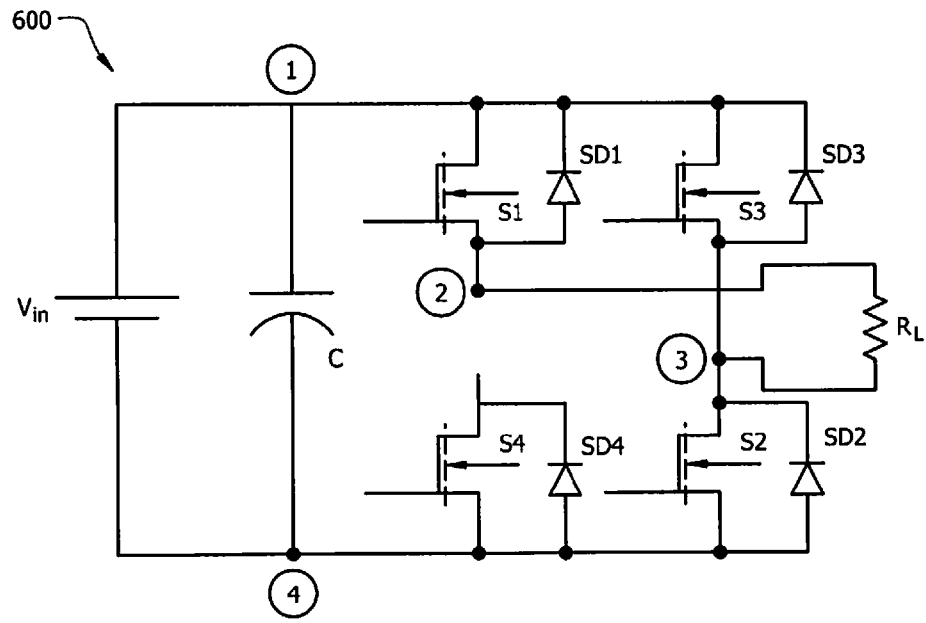
*FIG. 6*
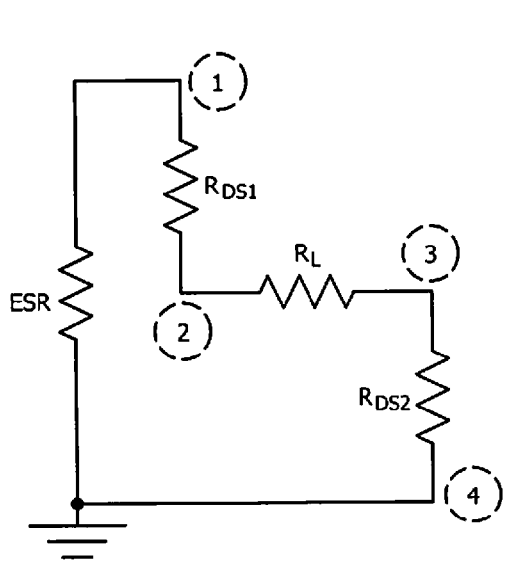 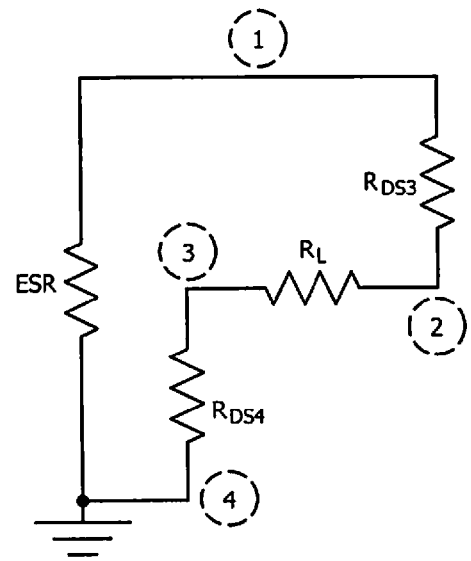
*FIG. 7A*          *FIG. 7B*

Variation in $R_{DS}$ with aging

Output voltage as a function of $R_{DS}$

Duty cycle variation as a function of $R_{DS}$

MOSFET failure rate as a function of $R_{DS}$

Converter failure rate as a function of $R_{DS}$

Mean time to failure rate of the converter as a function of $R_{DS}$

STATE OF HEALTH ESTIMATION OF POWER CONVERTERS

TECHNICAL FIELD

The present application is related to monitoring the state of health of electronic components which are functioning live within a system.

BACKGROUND

Power converters are complex circuits having both power and mixed signal processing. Such circuits also have a wide range of applications, and the continuous operation of these converters is imperative in most cases. In order to ensure a failure-free operation, converters employed in critical applications are being operated with redundancy and need to go through periodic maintenance and replacements. Generally, this periodic maintenance is implemented when the converter meets a calculated mean time to failure (MTTF). Accordingly, it is desirable to have power converters maintaining a failure-free operation until they reach the calculated MTTF. Such periodic maintenance is time and cost intensive which places a large burden on an entity when maintenance is required.

Unfortunately, the functionality and performance of a power converter degrades with time, and the amount of degradation may depend on several associated factors (i.e. more than just time) such as any overload, ambient temperature, switching impulses, loading variation and so on. Each of these stressful conditions may lead to severe degradation of the critical components in the converter or even can cause permanent damage in some cases. Over longer periods, these conditions coupled with various other environmental factors (mechanical vibration, high temperature, radiation) cause continuous aging of converter components which in turn cause gradual performance degradation.

Therefore, effectiveness and utilization factor of power converters could be greatly enhanced if the power converters' state of health could be identified with a reasonable degree of accuracy. To the knowledge of the inventors, there is no known technique to predict the remaining life or state of health of a power converter while the power converter is operational, and the accurate time to replace the power converter cannot be calculated using conventional prediction models.

BRIEF SUMMARY

The present application provides for systems, methods and devices which utilize Spread Spectrum Time Domain Reflectometry (SSTDR) techniques to measure degradation of electronic components. Such measurements may be implemented while the components are "live" or otherwise functioning within an overall system.

In one embodiment, monitoring a power converter in a high power system is accomplished. In this embodiment, degradation of components within the power converter (e.g. metal-oxide-semiconductor field-effect transistors (MOSFETs), capacitors, insulated-gate bipolar transistors (IGBTs), and the like) may be monitored by processing data from reflections of an SSTDR signal to determine changes in impedance, capacitance, or any other changes that may be characteristic of components degrading. For example, an aged MOSFET may experience an increase of drain to source resistance which adds additional resistance to a current path within a power converter. Such a change is able to be analyzed upon processing the reflected test signals.

In accordance with another embodiment a method for estimating the state of health of an electronic component is provided. The method includes placing the electronic component under test while electronic component is in a live working condition. A test signal is then propagated into the electronic component. In some embodiments, the test signal is configured to be non-interfering with the functionality of the electronic component. The method then receives reflections of the propagated test signal from the electronic component at a testing device and processes the reflected signal to determine at least one performance-degradation characteristic of the electronic component.

Another embodiment is characterized as a system which includes a power converter configured to modify properties of electrical power propagating in the system. Further, a state of health testing device is included which is configured to transmit a test signal into a power converter while the power converter is functioning within the system. The state of health testing device is further configured to monitor reflections from the test signal and process the received data in order to analyze effects that occur as a result of degradation of components within the power converter.

Yet another embodiment may be characterized as a device comprising at least one power converter. The power converter is configured to connect to a testing system while the power converter is in live operation. Further, the power converter is configured to receive a test signal which does not interfere with the functionality of the power converter and to output a reflected signal that conveys data which may be analyzed to determine one or more degradation properties of at least one component within the at least one power converter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 6 illustrates a schematic diagram for testing electronic components in accordance with an embodiment of the present application.

FIGS. 7A-7B illustrate equivalent circuit diagrams for the electronic components of FIG. 6.

DETAILED DESCRIPTION

The present application provides for non-intrusive testing techniques as well as mathematical quantifications of the state of health (SOH) of live power systems, such as systems involving power converters and electric machines. Several component parameters such as ON resistance, switching characteristics of MOSFETs/IGBTs, and equivalent series resistance (ESR) of capacitors degrade with aging. Such parameters are useful to provide measurable quantities to identify the aging level of a power converter. In addition, the degradation of winding insulation is likely to happen in aged machines being operated at high temperatures. Using spread spectrum time domain reflectometry (SSTDR), measurements such as impedance in the various current paths, as well as any fault with distance information inside the circuit, can be identified without interrupting the circuit's normal operation.

In some embodiments, based on the test data obtained from the SSTDR measurements, a system specific impedance matrix may be created and utilized to formulate the impedance and distance information in various current paths. Multiple matrix operators as well as a statistical analysis/error minimization may be used to quantify various properties of this matrix, and the results may be used for comparison, such as to a similar matrix obtained from a new (with zero aging) converter circuit or obtained from other known states. Therefore, the normalized "health index" which reflects the amount of aging associated to the power system may be generated and later utilized to estimate the SOH of the power system when testing various devices.

Figure 1:
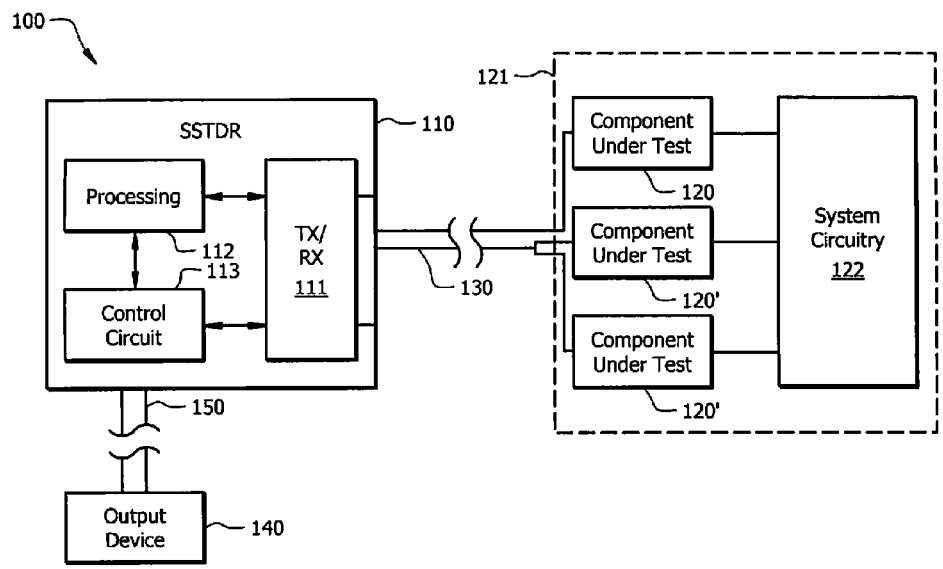
FIG. 1 illustrates a state of health testing system in accordance with an embodiment of the present application.

FIG. 1 illustrates a state of health testing system 100 in accordance with an embodiment of the present application. Testing system 100 includes SSTDR circuitry 110 and test component 120 which are connected across connection 130. Testing system 100 may also include output device 140 which is connected to SSTDR circuitry 110 across connection 150. Testing system 100 is configured to monitor changes in test component 120 which are indicative of the aging of component 120 (or of particular portions within component 120, such as one or more electronic components).

SSTDR circuitry 110 includes transmit/receive circuitry 111, signal processing circuitry 112, and control circuitry 113. Transmit/receive circuitry 111 is configured to send a test signal across connection 130 into test component 120 and receive reflections of the test signal back at SSTDR circuitry 110. In some embodiments, the test signal will comprise a sine wave signal in the 1-100 MHz range, however, different ranges may be utilized based on the specific application, e.g. when shorter or longer wavelengths will provide for improved data acquisition. The power level of such a signal may be selected based on various circuit parameters. It is noted that in some embodiments a tradeoff may occur in that a higher power test signal may provide for better resolution of a reflected signal, however, if the power of the test signal is too high the signal may interfere with the functionality of test component 110. In some embodiments, the test signal is sent to test component 120 which is configured to propagate within the noise floor of operational signals which are present in component 120 during the normal functionality of the component.

In some embodiments transmit/receive circuitry 111 may be divided into separate portions within SSTDR circuitry 110. Such a division may be useful to allow for better data acquisition, e.g., by reducing the amount of noise or interference received at a receiving portion of receiving circuitry 111. Such a separation may also be useful if continuous operation is desired. Further, some embodiments may have a plurality of transmit/receive circuitry portions which are configured to monitor a plurality of separate components. Alternatively, a single SSTDR circuit 110 may be configured to monitor multiple test components. In other words, embodiments are not limited to a 1:1 relationship between SSTDR circuitry 110 and test component 120.

SSTDR circuitry 110 includes signal processing circuitry 112 which is configured to analyze received signal data which has propagated from test component 120 over connection 130. Analyzing received signal data may include analyzing any number of parameters such as power loss, phase shift, frequency shift, etc. Accordingly, any measured property that may be derived from a received signal which is probative of a property of the functionality of test component 120 may be utilized in various embodiments. It is noted that in some embodiments, signal processing circuitry may also be utilized to generate or form the transmission test signals. The results derived from processing circuitry 112 may be output to output device 140 across connection 150.

In some embodiments, processing circuitry 112 may provide raw data for output which may be later processed and analyzed. Moreover, processing circuitry 112 may be utilized to determine/calculate degradation data. Such data may be compared to a state of health index (either by processing circuitry 112 or at a later time by a different processing device) in order to produce a result that is indicative of the aging or remaining life of a component under test. The state of health index may be pre-defined based on earlier testing data. Further, the state of health index may be updatable as it continues to monitor various components and observe the effects of aging and reliability of such components.

Control circuitry 113 of SSTDR circuitry 110 may function to form the test signals, determine timing of when to transmit/receive signals, control signal processing and analysis of received data, etc. Additionally, control circuitry 113 may be configured to control the input and output of data within SSTDR device 110. Input data received at SSTDR circuitry 100 may include parameters regarding when, what and how to test a component, updates to a state of health index, etc. Data which is output from SSTDR circuitry may include results which are to an external device, e.g. device 140, for further processing and/or display. While it is not shown in FIG. 1, it is noted that SSTDR circuitry 110 may include a display which is integrated within the device and input functionality which allows a user to specify testing parameters.

Test component 120 may be any type of component which may be tested under the conditions described herein. In one embodiment, test component 120 may be one or more components of a photovoltaic system, such as a solar panel. In one embodiment, test component 120 is a power converter. Such a power converter may function as part of an overall system 121 which includes further system circuitry 122 which facilitates the functionality of system 121. For example, system 121 may be a power distribution network (e.g. a high voltage DC transmission system), an automobile, and the like. Further, as noted above, in some embodiments system 121 may include a plurality of components/power converters 121-121' and state of health system 100 may be configured to monitor each of these components.

Connections 130 and 150 may be implemented in any manner sufficient to convey the requisite data transmitted between the respective devices of system 100. Such connections may be implemented in one or more of a wired or wireless connection. Additionally, in some embodiments, connection 130 may be configured to connect to component 120 in a manner where it can utilize existing input/output portions of component 120 without interfering with the functionality of component 120. In other embodiments, component 120 may be provided with dedicated connection points for testing circuitry.

Figure 2:
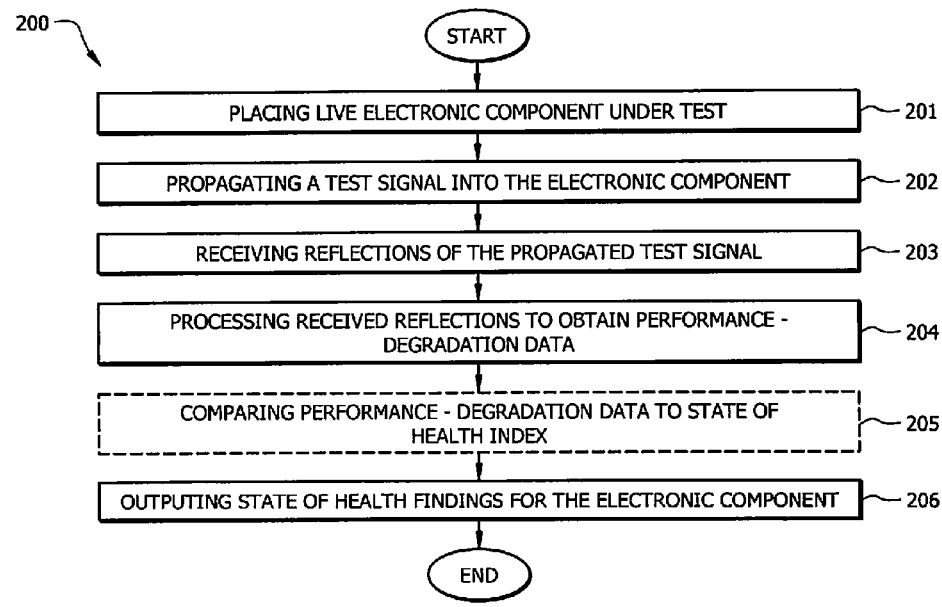
FIG. 2 illustrates a method for estimating the state of health of an electronic component in accordance with an embodiment of the present application.

FIG. 2 illustrates a method 200 for estimating the state of health of an electronic component in accordance with an embodiment of the present application. Method 200 may be implemented within a system such as system 100 or any other suitable system. Additionally, while method 200 is set forth in steps, it is noted that nothing in this application necessarily limits the order in which the illustrated steps are implemented. In fact, some steps may be implemented in different orders, simultaneously, at multiple points in time, or not at all.

Method 200 includes the step of placing an electronic component under test while the electronic component is in a live working condition 201. It is noted that as used herein, the term "live" connotes that the electronic component is functioning in its intended setting. For example, if the component is a power converter within an automobile, the component is placed under test while connected and functioning within the automobile. It is further noted that while the electronic component under test may be an overall device, such as a power converter, the testing circuitry may be configured to test individual components within the power converter such as one or more MOSFETs, capacitors, inductors, IGBTs, and the like.

At block 202 a test signal is propagated into the electronic component. This test signal will generally be configured to be non-interfering with the functionality of the electronic component. For example, as discussed above, the test signal may be a low power signal that functions within the noise floor of the device under test. Further, embodiments may utilize SSTDR methodology to implement such a test signal.

At block 203, reflections of the propagated test signal are received from the electronic component at a testing device. The received reflections are then processed to determine at least one performance-degradation characteristic of the electronic component at block 204. Examples of degradation characteristics may include changes in impedance characteristics, effects on capacitance and/or ripple current filtering, changes in power dissipation, etc. Such characteristics are discussed in further detail below.

In some embodiments, method 200 may include the step of comparing performance-degradation data to a state of health index at block 205. Such an index may be pre-calculated based on observed laboratory data and/or may be populated based on observed performance within a system. Populating based on observed performance may be advantageous due to the fact that even similar systems may be implemented in different environments. For example, power distribution systems may be located in areas where ambient temperature ranges from over +100 degrees to −20 degrees Celsius. Such differences may impact degradation characteristics and it may be desirable to take these differences into account.

At block 206, state of health findings for the tested electronic component are output. Such an output may comprise a simple display of the data, a transmission of the data to a system administrator for additional analysis, etc. Any output which is useful to convey the tested/analyzed data may be implemented.

The following discussion provides examples of individual component characteristics and testing data in order to illustrate example characteristics which may be monitored in accordance with the concepts outlined in the present application. Such examples are intended to provide insight to one of ordinary skill in the art and are not intended to limit the invention. Additionally, it is noted that the discussion below is in reference to power converters and the failure of components on such devices. While this is currently the preferred use of the concepts discussed herein, embodiments should not be limited to such devices.

Research has been undergoing which attempts to identify the microscopic failures in electronic components, for example, to determine what is physically happening to a MOSFET which causes eventual wear and tear of the component. Such research does not extend to identifying the translated measurable quantities which correspond to the changes—i.e. how the microscopic changes are converted into physical device parameters. Further, there is no known method which attempts to measure these quantities in a live circuit setting and estimate the state of health of an overall device.

Switching devices have higher failure rates in power converters. Additionally, approximately 31% of the total failure of a power converter occurs due to the failure of semiconductor switches, and 60% of the total failure occurs due to electrolytic capacitor breakdown. In addition to these active and passive components, interconnections among these components fail at times due to elevated current and thermal stress. Components with degraded electrical characteristics eventually cause secondary and tertiary effects that can accelerate the aging process in a circuit having multiple control loops. Degradation and failure of these components may be due to long term operation under normal operating condition or due to short term operation under extreme stress condition, e.g. high ambient temperature, high voltage, reverse bias and high ripple current.

Degradation in capacitors: Equivalent series resistance (ESR) of a capacitor increases with aging, and the capacitance decreases over time due to current and thermal stresses. The performance of an electrolytic capacitor is affected by operating conditions such as voltage, current, frequency, and temperature. The primary failure mechanism of the electrolytic capacitor is the evaporation of the electrolyte solution, and this process accelerates with temperature-rise caused by ripple currents, over voltage, high ambient temperature and so on. As the electrolyte solution dries up, the effective contact area between the electrodes decreases resulting in a decrease in capacitance and increase in ESR. This undesirable rise in ESR causes additional power loss inside the capacitor, and this loss further accelerates the degradation and eventually leads the capacitor to fail. Electrolyte loss causes a continuous rise in ESR according to $ESR=ESR^0/v^2$, and $v=V/V^0$ denotes the normalized electrolyte volume. The capacitor will be at the end of its useful lifetime if it loses 30%-40% of its initial electrolyte volume—e.g. when ESR goes up by a factor of 2 to 3. In addition to this gradual degradation, five external factors could cause rapid permanent failures is capacitors, and these factors are—high voltage, transients, reverse bias, vibrations and high ripple current.

Degradation in MOSFETs: The ON-resistance or the channel/junction voltage of a switching device (MOSFET, IGBT, diode etc.) increases with time and is found to be a significant aging factor in power MOSFETs. This higher ON resistance is responsible for increased conduction loss resulting in degraded performance. It is found in the literature that large area (0.56 $cm^2$) SiC power MOSFETs with voltage and current ratings of 1200V and 67 A respectively are affected by high temperature gate bias (HTGB) stress as well. This analysis shows that if the device is being operated under high temperature with high stress at the gate, it may eventually have higher/lower threshold voltage depending on the type of stress and types of MOSFET (N channel or P channel). While applying high voltage at gate terminal, the threshold voltage increases with aging, and this shift directly corresponds to an increase in switching time. Therefore, the change in the threshold voltage can be considered as the precursor to failure.

Figure 3A:
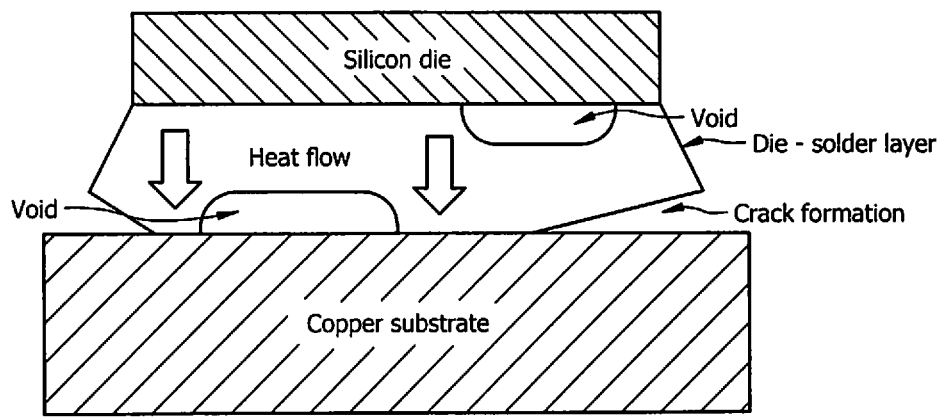
FIGS. 3A-3B illustrate common degradation problems of a power MOSFET.
Figure 3B:
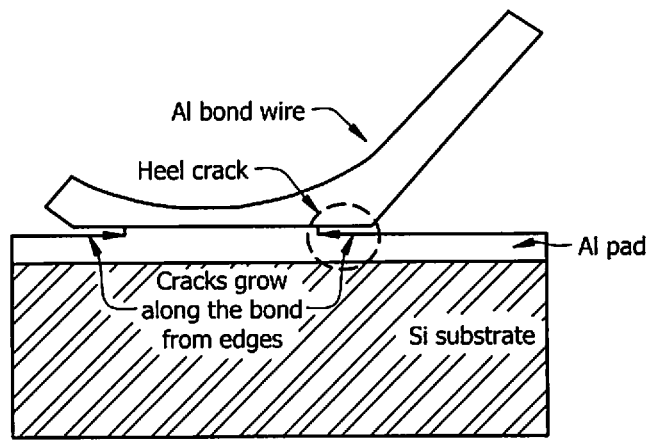

A common failure mechanism in discrete power MOSFETs is die attachment degradation. $R_{DS}$ increases due to the degradation at metallization and at the contact area of bonding wire metallization. $R_{DS}$ may also increase due to thermal aging of MOSFET. FIGS. 3A and 3B illustrate these phenomena, e.g. the origination of cracks and voids in a power MOSFET due to aging and wire bonding failure. When designing a MOSFET, in order to reduce switching loss, faster switching speed is required and hence smaller gate area is needed. Moreover, a thinner gate oxide layer assists in keeping the threshold voltage reasonably low. Therefore, the thin oxide layer makes the MOSFET susceptible to permanent damage caused by temporary over-voltages at the gate. The effect of this damage could be accumulated over time and would lead to a decrease in performance. Eventually the damage will cause the MOSFET to exhibit a complete switching failure.

Packaging related failures may occur due to the dissimilarity between the coefficients of thermal expansion (CTE) of the chip and the package. The types of failures are bond failures and die solder layer failure. Bond failure is mainly caused by crack growth at the bond wire/chip interface due to different CTEs between silicon and aluminum. Intermetallic compounds are increased and Kirkendall voids are formed at the bond-pad interface at higher temperature (see FIGS. 3A and 3B).

Degradation in IGBTs: Threshold voltage, transconductance, and collector-emitter ON voltage may be used to identify aging in IGBTs. Bond wire lift-off can be electrically detected by measuring collector-emitter voltage $V_{CEsat}$ of an IGBT, and this failure can be detected from 5% increment of $V_{CEsat}$. The maximum peak of the collector-emitter ringing at the turn OFF may also be utilized as a degradation variable. The switching turn-OFF time and switching ringing are also recognized as failure precursors and may be used to characterize degradation. Additionally, oxide damage may affect threshold voltage, and die attach degradation affects transconductance and collector-emitter ON voltage. Such characteristics and the effects of the characteristics may be measured in accordance with one or more embodiments described herein.

Example Results

The following provides a discussion of example tests which illustrate characteristic changes in circuit component functionality which may be measured while a component is functioning. These tests utilized an SSTDR test circuit such as describe above with respect to FIG. 1.

Figure 4:
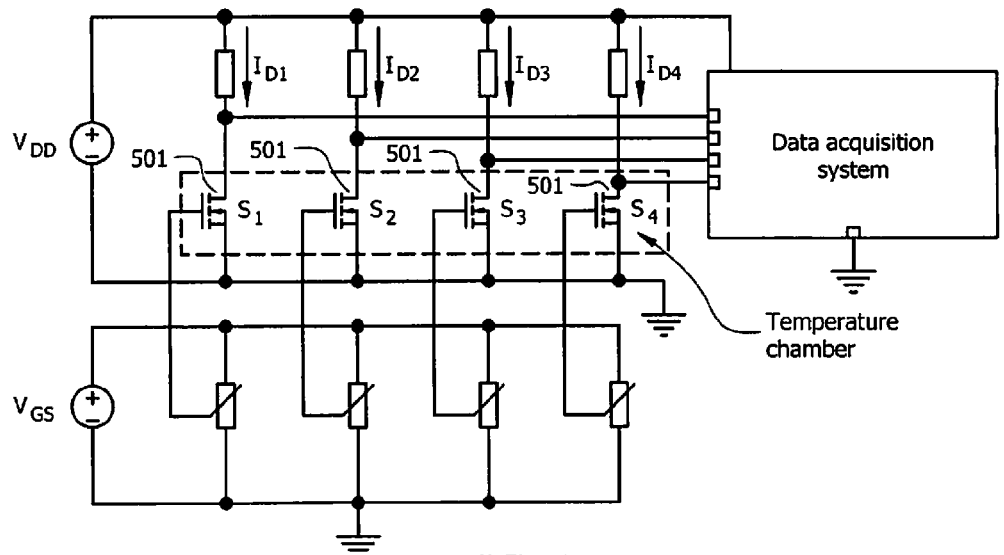
FIG. 4 illustrates a schematic diagram for characterizing MOSFETs and IGBTs using data acquisition systems in accordance with an embodiment of the present application.
Figure 5:
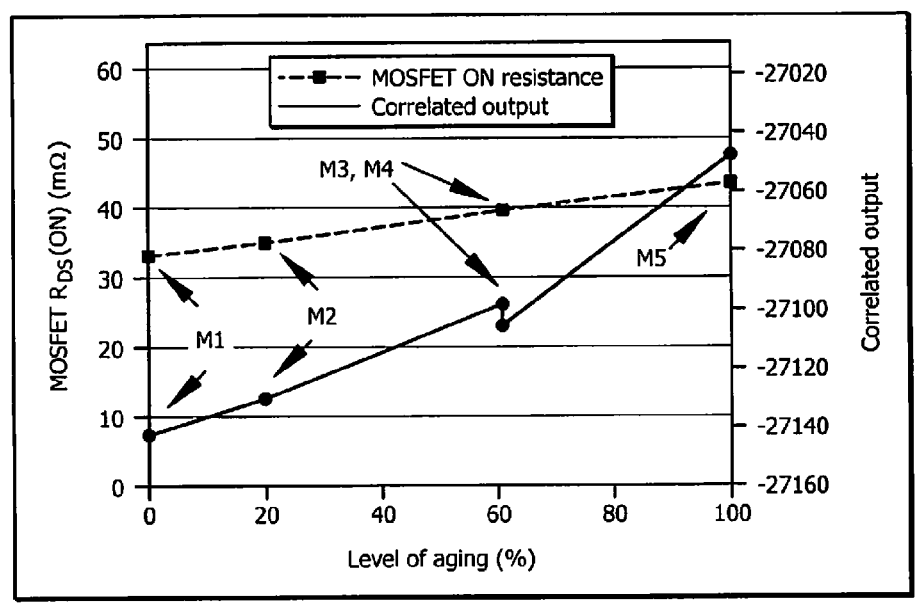
FIG. 5 illustrates an aging plot for an electronic component in accordance with an embodiment of the present application.

Characterization of MOSFETs: The SSTDR test hardware was used to identify the aging process in five (5) different power MOSFETs 501 having the same part number, in the arrangement as shown in FIG. 4. It is noted that the arrangement shown in this figure could be used with MOSFETs or IGBTs. A first MOSFET was used as the reference as zero stress was applied to it. 8 W of power stress was applied to the remaining four MOSFETs for different time intervals to have accelerated aging. The ambient temperature of these MOSFETs was stabilized between 100° C.-110° C. during this accelerated aging process using an environment chamber. Once the aging process was completed, these MOSFETs along with the reference MOSFET were individually characterized while they were connected in a DC-DC converter. The obtained results have been summarized in Table 1 and plotted in FIG. 5.

TABLE 1

Correlated Output And Measured $R_{DS}$ For Several Mosfets Aged By Applying Both Power And Temperature Stress

| MOSFETs | M1 [New] | M2 [Aged] | M3 [Aged] | M4 [Aged] | M5 [Aged] |
| --- | --- | --- | --- | --- | --- |
| Duration of aging | — | 60 Minutes | 120 Minutes | 180 Minutes | 240 Minutes |
| $R_{DS}$ (mΩ) after aging | 33.26 | 35.34 | 39.57 | 39.58 | 43.65 |
| Correlated amplitude | −27142 | −27130 | −27099 | −27105 | −27049 |

It is apparent that the measured correlated output was consistent with the level of aging. A 240 minutes accelerated aging was considered to be 100%, and the corresponding $R_{DS}$ variation was 31.24%.

Characterization of Capacitors: In this example, three SEK102M010ST aluminum electrolytic capacitors (C2, C3, C4) were aged using temperature stress in a simple parallel RC circuit at 150° C., 160° C., and 170° C. respectively, and each of them were stressed for one hour. The changes in capacitance and ESR were measured after the capacitors reached room temperature, and an LCR meter was used to take these measurements at 60 Hz. SSTDR was applied to these aged capacitors (C2, C3, C4) and a new capacitor (C1) while 3V (RMS) 60 Hz ac was applied across these capacitors. The change in capacitance, the ESR, and correlated outputs from SSTDR hardware for aged capacitors and the new capacitor are given in Table 2.

TABLE 2

ESR And Correlated Output Variations In Electrolytic Capacitors As A Function Of Aging

| Capacitors | C1 [New] | C2 [Aged] | C3 [Aged] | C4 [Aged] |
|---|---|---|---|---|
| Capacitance (μF) before aging | 1003 | 1001 | 998 | 997 |
| Capacitance (μF) after aging | 1003 | 968 | 953 | 942 |

TABLE 2-continued

ESR And Correlated Output Variations In Electrolytic Capacitors As A Function Of Aging

| Capacitors | C1 [New] | C2 [Aged] | C3 [Aged] | C4 [Aged] |
|---|---|---|---|---|
| ESR (mΩ) before aging | 197 | 197 | 200 | 195 |
| ESR (mΩ) after aging | 197 | 208 | 223 | 220 |
| Correlated amplitude | −20862 | −19794 | −19117 | −19109 |

As can be seen, the ESR increased and the corresponding capacitances decreased due to this thermal stress, and the SSTDR system can identify these variations.

Characterization of IGBTs: In this example, three IRGI4090PbF trench IGBTs were stressed in a controlled environment, and SSTDR was applied to identify the aging of these IGBTs. A 1V DC voltage was applied between the collector and emitter of each IGBT, and the surface temperature increased to 150° C. within ten minutes due to the high power dissipation (~8.5 W) across it. These IGBTs were placed in a controlled temperature chamber, and the ambient temperature was maintained at 110° C. The above procedure was applied to three different IGBTs for different time durations. They were cooled down to the room temperature, and the characteristics were measured. SSTDR technique was applied to the aged IGBTs (G2, G3, G4) and to the new IGBT (G1) for comparison purpose. The results can be seen in Table 3 below.

TABLE 3

Correlated Output And Measured $V_{CE}$, $R_{CE}$ For Multiple IGBTs Aged By Accelerated Power Stress

| IGBTs | G1 [New] | G2 [Aged] | G3 [Aged] | G4 [Aged] |
|---|---|---|---|---|
| Duration of aging | — | 60 Minutes | 120 Minutes | 180 Minutes |
| $V_{CE}$ (V) after aging | 0.953 | 0.975 | −1.1 | −1.5 |
| $R_{CE}$ (mΩ) after aging | 35.01 | 36.79 | 41.706 | 60.606 |
| Correlated amplitude | −27449 | −27391 | −27358 | −27140 |

As can be seen, the collector to emitter voltage ($V_{CE}$) significantly increased due to this accelerated aging. This accelerated stress changed the effective impedance ($R_{CE}$) between the collector and emitter for the same operating conditions, and these changes were measurable in the corresponding SSTDR amplitudes.

Characterization of inductors: In order to explore the SSTDR hardware's capability to detect faults in a motor or transformer winding, SSTDR was applied to an inductor which is functionally equivalent to a transformer winding. This particular ferrite-core inductor was tested with and without the core. A 100 turn inductor was tested in five different conditions where each condition had a different short circuit situation. This experimental data has been summarized in Table 4 below.

TABLE 4

Correlated output while SSTDR was applied to a 100-turn coil with a short circuit between turns (ten turns apart).

| | Open coil (No short circuit between turns) | Single short between 25 and 35 turns | Single short between 35 and 45 turns | Single short between 45 and 55 turns | Single short between 55 and 65 turns | Single short between 65 and 75 turns |
|---|---|---|---|---|---|---|
| No core | −10389 | −12923 | −15303 | −13922 | −14307 | −15428 |
| With core | −8262 | −12550 | −15618 | −14913 | −14763 | −16772 |

As expected, the SSTDR output was able to identify the short, and the location of the short circuit was more predictable when the test is done with the core. In some embodiments, the pattern of the SSTDR signal output may be used to identify the location of the fault could be identified with a greater precision within the windings. For reference, the 60 Hz AC impedance of the coil (no core, no short) was 1.2Ω and it became 1.11Ω when a short was created between turns with a gap of 10 turns. However, when the inductor was tested with the core, the measured impedance was 26Ω (no short), and it became 10Ω with a single short in the winding.

Implementation in a power converter: FIG. 6 illustrates a schematic diagram of an example DC-AC inverter circuit 600 which has been tested in order to analyze reflection data when single or multiple components are aged inside of the converter 600. Converter 600 has two operating states, of which the equivalent circuits are shown in FIGS. 7A and 7B. In this example, $[R_{DS1}\ R_{DS2}\ R_{DS3}\ R_{DS4}\ ESR\ R_L]^T = [0.034\ 0.034\ 0.034\ 0.034\ 0.017\ 5]^T$.

Using the equivalent circuits shown in FIGS. 7A and 7B, it is possible to calculate the equivalent impedance across any node pair. For this specific converter, a non-linear operator shown below is used to obtain a matrix with impedance information across all node pairs.

$$\begin{bmatrix} R_{DS1} \\ R_{DS2} \\ R_{DS3} \\ R_{DS4} \\ ESR \\ R_L \end{bmatrix} \rightarrow$$

Impedance vector $$\begin{bmatrix} X_{12} = \frac{(R_{DS1})(S-R_{DS1})}{S} \\ X_{23} = \frac{(R_L)(S-R_L)}{S} \\ X_{34} = \frac{(R_{DS2})(S-R_{DS2})}{S} \\ X_{14} = \frac{(ESR)(S-ESR)}{S} \\ X_{13} = \frac{(R_{DS1}+R_L)(R_{DS2}+ESR)}{S} \\ X_{24} = \frac{(R_{DS2}+R_L)(R_{DS1}+ESR)}{S} \end{bmatrix} \rightarrow \begin{bmatrix} X_{11} & X_{12} & X_{13} & X_{14} \\ X_{21} & X_{22} & X_{23} & X_{24} \\ X_{31} & X_{32} & X_{33} & X_{34} \\ X_{41} & X_{42} & X_{43} & X_{44} \end{bmatrix}$$

Non – linear operator

Impedance matrix

For i=1-4 and j=1-4, Xij represents the equivalent impedance between any two test points among the four different nodes. Xij=0 for i=j because it would be a short circuit. Therefore, all the diagonal elements of this matrix are "0." In fact, there exist two impedance matrices for two different operating states of the converter, and the two non-aged matrices are expressed as:

$$A = \begin{pmatrix} 0 & 0.03377 & 0.05048 & 0.01694 \\ 0.03377 & 0 & 0.08357 & 0.05048 \\ 0.05048 & 0.08357 & 0 & 0.03377 \\ 0.01694 & 0.05048 & 0.03377 & 0 \end{pmatrix}$$

State 1

$$A = \begin{pmatrix} 0 & 0.05048 & 0.03377 & 0.01694 \\ 0.05048 & 0 & 0.08357 & 0.03377 \\ 0.03377 & 0.08357 & 0 & 0.05048 \\ 0.01694 & 0.03377 & 0.05048 & 0 \end{pmatrix}$$

State 2

Because of the non-linearity of the system, it is not possible to inverse the operator and to determine the impedance vector from the impedance matrix. In order to identify the variation in impedances, a determination the new impedance vector consistent with the aged converter is needed, and a comparison with the initial vector can be used to identify the level of aging. Even if the impedance matrix and the non-linear operator are known, the process is not reversible because of its non-linear nature. Therefore, an error function was defined in MATLAB with the following expression:

$$F = \sqrt{(X_{13}-X_{e13})^2 + (X_{24}-X_{e\_24})^2}$$

In order to verify whether the impedance matrix could give us any aging information, a test case was created where the impedance vector was the following. The affected components are $R_{DS1}$, $R_{DS2}$ and ESR. $[R_{DS1}\ R_{DS2}\ R_{DS3}\ R_{DS4}\ ESR\ R_L]^T = [0.042\ 0.040\ 0.034\ 0.034\ 0.020\ 5]^T$. Due to the aging associated with these three components, the actual impedance matrix in state 1 looks like the matrix:

$$A = \begin{bmatrix} 0 & 0.04165 & 0.05929 & 0.01992 \\ 0.04165 & 0 & 0.09996 & 0.06125 \\ 0.05929 & 0.09996 & 0 & 0.03968 \\ 0.01992 & 0.06125 & 0.03968 & 0 \end{bmatrix}$$

Figure 8:
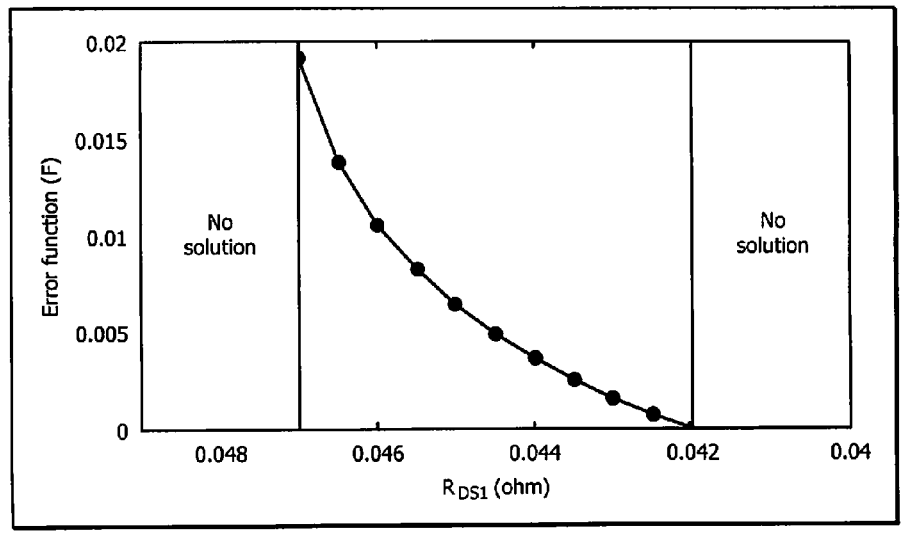
FIG. 8 illustrates an error function plot for an electronic component in accordance with an embodiment of the present application.

Using the error function, an iterative program was executed in MATLAB, and $R_{DS1}$ was varied from 0.033Ω to 0.420Ω with a 0.0005Ω interval. The corresponding simulation results have been summarized in Table 5 below and the variation in error function as a function of $R_{DS1}$ has been plotted in FIG. 8.

TABLE 5

Simulation Results Of The Converging Steps Used To Identify the New $R_{DS1}$, $R_{DS2}$ And ESR

| $R_{DS1}$ (Ω) | $R_{DS2}$ (Ω) | $R_L$ (Ω) | ESR (Ω) |
|---|---|---|---|
| 0.04700 | 0.04447 | 0.24379 | 0.02099 |
| 0.04650 | 0.04403 | 0.29503 | 0.02090 |
| 0.04600 | 0.04359 | 0.34641 | 0.02081 |
| 0.04550 | 0.04314 | 0.40568 | 0.02072 |
| 0.04500 | 0.04270 | 0.47892 | 0.02062 |
| 0.04450 | 0.04225 | 0.57486 | 0.02053 |
| 0.04400 | 0.04180 | 0.70895 | 0.02043 |
| 0.04350 | 0.04135 | 0.91294 | 0.02032 |
| 0.04300 | 0.04090 | 1.26542 | 0.02022 |
| 0.04250 | 0.04045 | 2.03055 | 0.02011 |
| 0.04200 | 0.04000 | 5.00000 | 0.02000 |

The error function becomes the smallest when $R_{DS1}$ equals to 42 mΩ—which is the correct solution, and this iterative solution can truthfully reconstructs the impedance vector from the impedance matrix. In live applications, the SSTDR hardware will measure reflections at various node pairs and therefore, constructs a matrix equivalent to the impedance matrix. By knowing the non-linear operator, the change in individual components is identified using this process.

Figure 9:
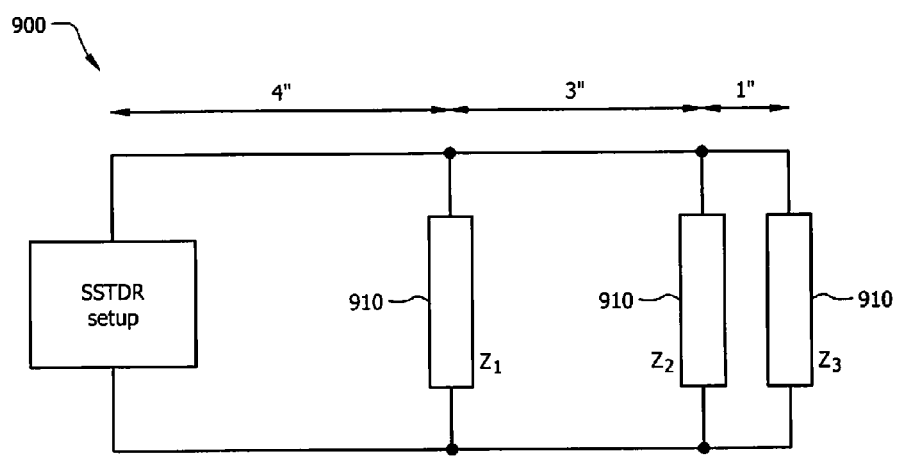
FIG. 9 illustrates a schematic diagram for testing electronic components in accordance with an embodiment of the present application.

In addition to measuring impedance across a node pair, the SSTDR system can segregate multiple loads connected across the same node pair. In real circuits, multiple current paths between a node pair could exist, and typically they have different physical locations on the circuit board. FIG. 9 illustrates a branched network 900 which comprises three parallel resistive loads 910 with different physical locations. This network may be used to illustrate the interaction of SSTDR with a branched network.

Figure 10:
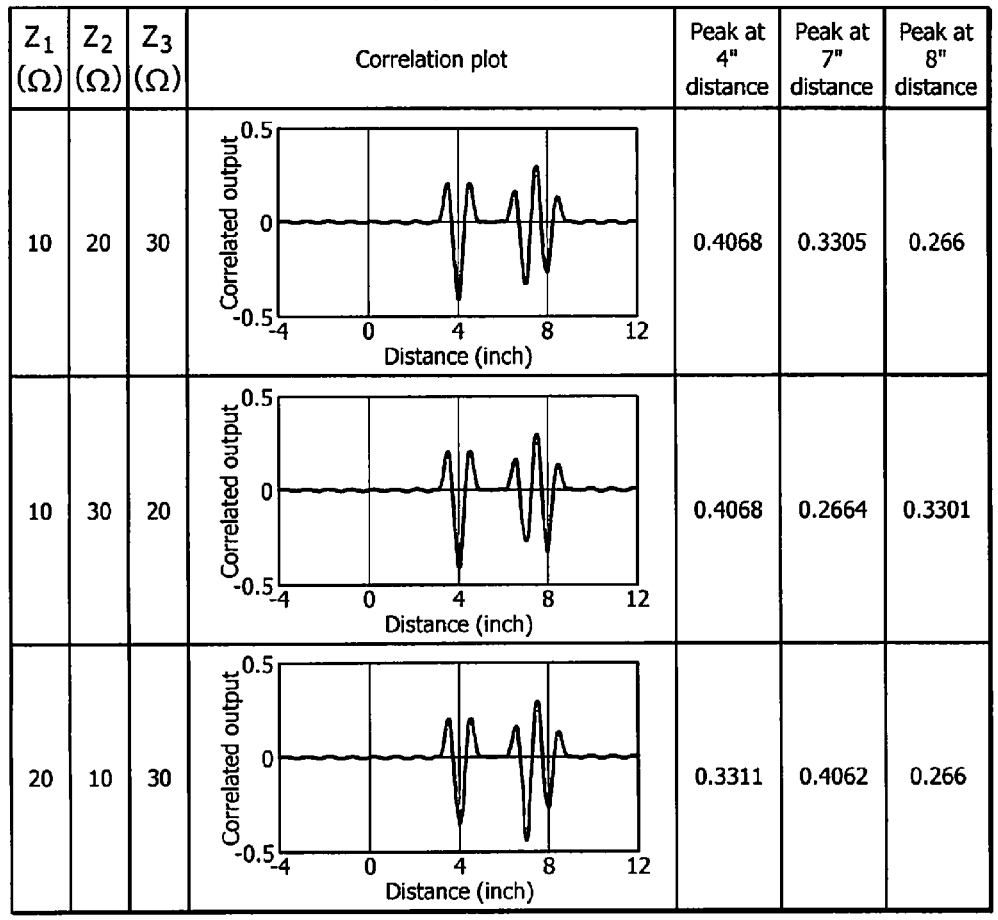
FIG. 10 illustrates an output result chart for the circuit of FIG. 9.

The SSTDR setup generated corresponding negative peaks for $Z_1$, $Z_2$ and $Z_3$. These results have been summarized in FIG. 10. As mentioned earlier, the SSTDR generates a positive correlated output for any open circuit and a negative output for a short. The magnitude of the negative output will depend on the impedance at discontinuity. Therefore, the magnitude of the correlated associated to a 10Ω impedance would be larger than the correlated output consistent with a 20Ω or the 30Ω impedance. When the arrangement of $Z_1$, $Z_2$ and $Z_3$ is 10Ω, 20Ω and 30Ω respectively, we obtain the highest (negative) correlated output at the 4" distance, and this has been demonstrated in the top row of FIG. 10. This negative peak is followed by a peak located at 7", and the smallest peak is located at the 8" marker. The middle and bottom row of FIG. 10 demonstrates the SSTDR output for other combinations of $Z_1$, $Z_2$ and $Z_3$.

As noted above, the proposed technique may be used to identify the nature and location of winding faults in electric machines such as motors and transformers. In addition, the proposed techniques may be utilized to identify faults or degradation in a hybrid system with motor drives and electric motors connected through DC and AC buses.

According to obtained initial results, the correlated output can identify any variation in inductance (Table 4), and it can also detect the presence of any short circuit in the coil. The test results clearly showed a pattern for short circuits distributed inside a winding. Therefore, embodiments may identify/monitor the interaction between the inductor and the SSTDR system and pinpoint the location of the winding failure with a greater precision.

Figure 11:
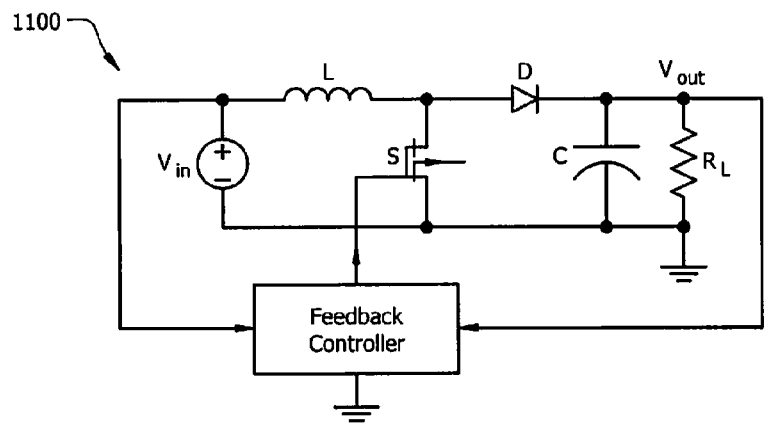
FIG. 11 illustrates a schematic diagram of a boost converter in accordance with an embodiment of the present application.

FIG. 11 illustrates another example power converter implementation which has been characterized, this example comprises a boost converter 1100 having a feedback control loop for maintaining a fixed output voltage. The various circuit parameters of boost converter 1100 are shown in Table 6. It was assumed that the $R_{DS}$ of the MOSFET changed from 34 mΩ to 44 mΩ due to natural aging (which is consistent with the experimental results summarized in Table 1).

TABLE 6

Circuit Parameters Of The Boost Converter

| Symbol | Description | Value |
|---|---|---|
| $V_{in}$ | Input voltage | 40 V |
| $V_{out}$ | Output voltage | 100 V |
| L | Inductance | 1 m |
| $r_L$ | Equivalent series resistance (ESR) of the inductor | 0.1 Ω |
| $r_{sw}$ | MOSFET ON resistance | 0.034-0.044 Ω |
| $r_D$ | Diode on resistance | 0.05 Ω |
| $V_f$ | Diode forward voltage | 0.5 V |
| C | Output capacitance | 10 μF |
| $r_C$ | ESR of the capacitor | 0.1 Ω |
| $R_L$ | Output resistance | 50 Ω |

Because the circuit has to maintain a fixed output voltage regardless of $R_{DS}$ variation, the control circuit needs to change the duty ratio to compensate for the additional voltage drop across the MOSFET. This will eventually increase the stress across the remaining components in the converter. Although most of the components will naturally age, only the MOSFET aging has been considered to simplify the analysis. Through this analysis, it is seen that this gradual increase in MOSFET $R_{DS}$ (ON) will increase the diode conduction loss, MOSFET conduction loss, and the output voltage ripple. Considering a constant failure rate, reliability of the system can be calculated as:

$$R_S(t) = e^{\lambda_{SYSTEM}(\pi_t)}$$

Here, $R_S(t)$ is the probability of system not failure by time t. The mean-time-to-failure (MTTF) can be calculated from the reliability probability as:

$$MTTF = \int_0^\infty R_s(t)dt$$

$$= \frac{1}{\lambda_{SYSTEM}}$$

Failure rate of an N-channel MOSFET can be written as: $\lambda_{sw} = \lambda_B \pi_T \pi_A \pi_E \pi_Q$, where $\lambda_B$=base failure rate=0.012 failures/$10^6$ hours, $\pi_A$ = application factor = 8, $\pi_Q$ = quality factor = 8, $\pi_E$ = environment factor = 9.0 (for equipment installed on wheeled or tracked vehicles), $\pi_T$ = temperature factor = $\exp\left[1 - 1925\left(\left(\frac{1}{T_1 - 273K}\right)\frac{1}{208K}\right)\right]$, $T_J = T_a + (\Theta_{JC} + \Theta_{CS} + \Theta_{SA})P_{sw} = T_a + (\Theta_{JA})P_{sw}$.

And we let:
$T_a$=ambient temperature=25° C.,
$\theta_{JC}$=junction to case thermal resistance,
$\theta_{CD}$=case to sink thermal resistance,
$\theta_{SA}$=sink to ambient thermal resistance,
$\theta_{JA}$=junction to ambient thermal resistance=62° C./W (based on the datasheet of different TO-220 package MOSFETs),
$T_J$=junction temperature,
$P_{sw}$=switch power loss.
Therefore, considering the values stated above, $$\lambda_{sw} = \lambda_B \pi_T \pi_A \pi_E \pi_Q = 0.012 \times \pi_T \times 8 \times 9.0 \times 8 = 6.912 \times \pi_T.$$

As an example, let us consider, power loss (conduction loss+switching loss) in a switch is 1.4 watt:

$$T_J = T_a + (\Theta_{JA})P_{sw}$$
$$= 25 + (62 \times 1.4)$$
$$= 111.8,$$

$$\pi_T = \exp\left[-1925K\left(\frac{1}{T_J + 273K} - \frac{1}{298K}\right)\right]$$
$$= 4.293631,$$

$$\lambda_{sw} = 6.912 \times 2.27319$$
$$= 29.677578 \text{ failures/million- hours,}$$

Using the calculations carried out for capacitors and diodes:

$$\lambda_{SYSTEM} = \lambda_{sw} + \lambda_{CAP} + \lambda_{DIODE}$$
$$= 31.035926 \text{ failure/millionhours}$$

Therefore, $$MTTF = \frac{1}{\lambda_{SYSTEM}}$$

$$= \frac{10^6}{31.035926} \text{ hours/failure}$$

$$= 32.2207 \times 10^3 \text{ hours/failure}$$

$$= 3.678 \text{ years/failure}$$

Figure 12A:
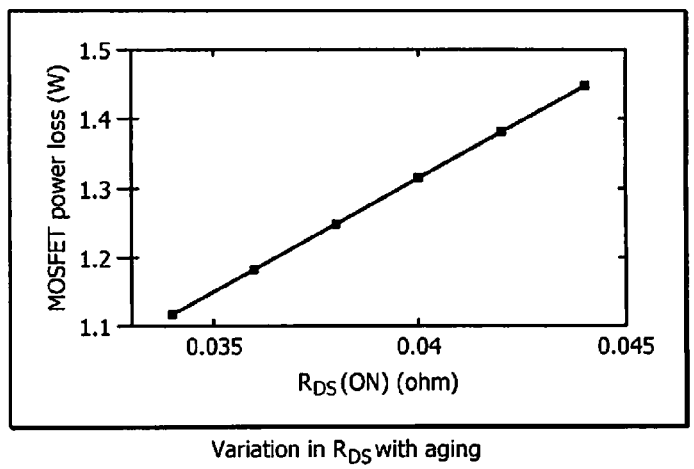
FIGS. 12A-12F illustrate test result plots corresponding to the circuit of FIG. 11.
Figure 12B:
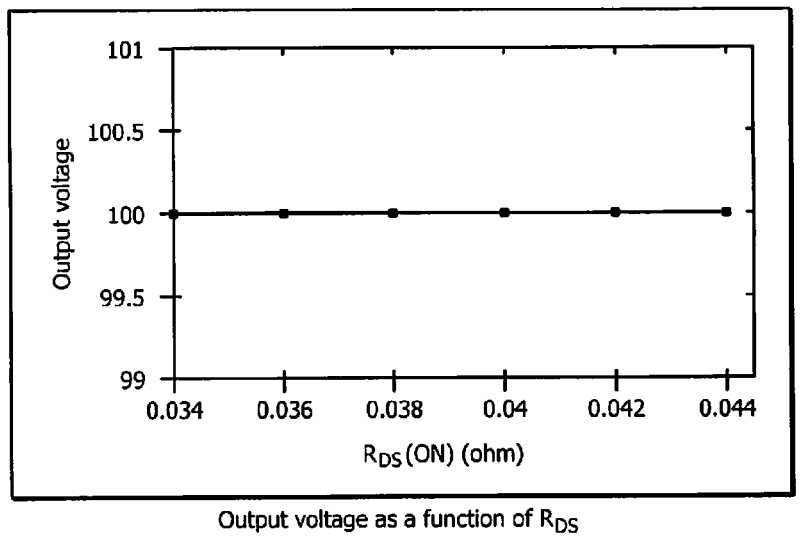
Figure 12C:
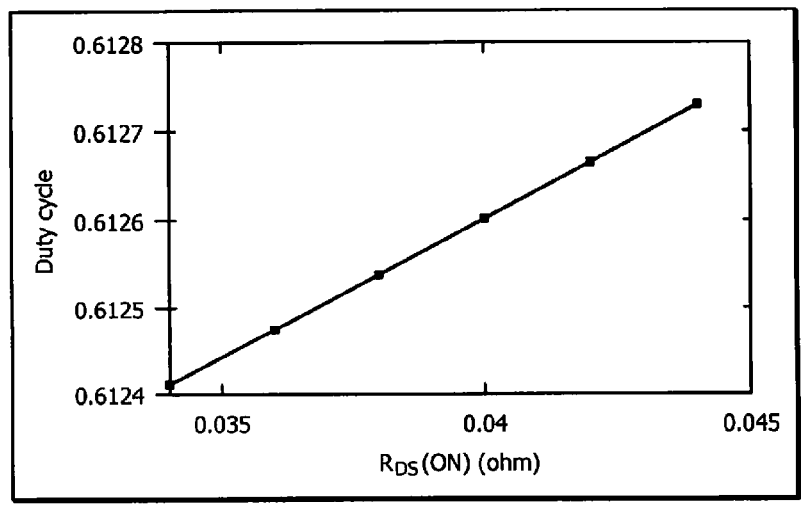
Figure 12D:
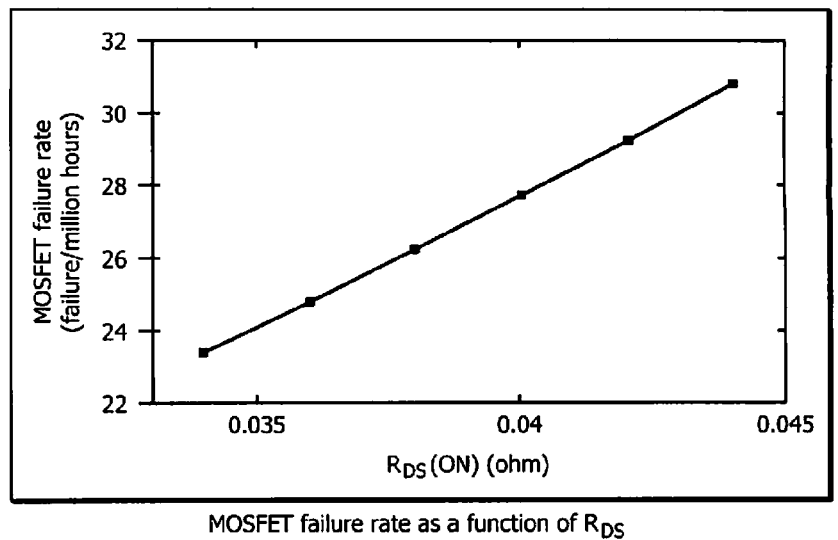
Figure 12E:
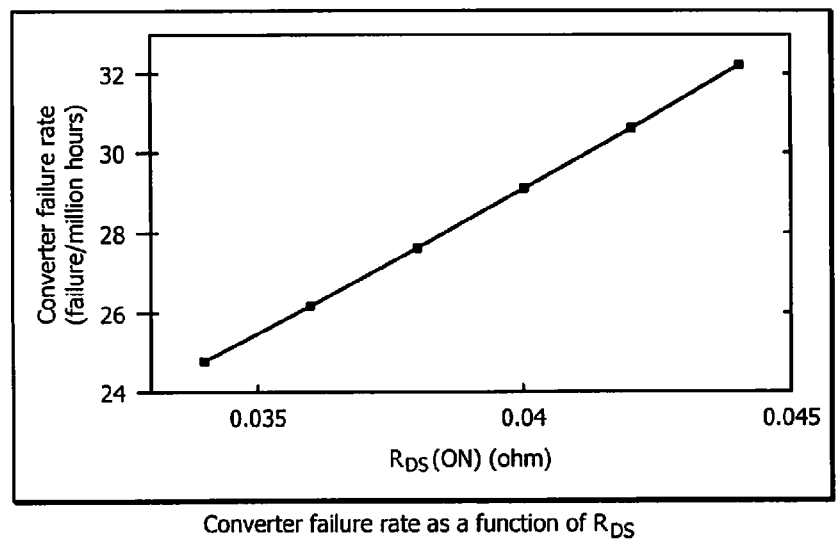
Figure 12F:
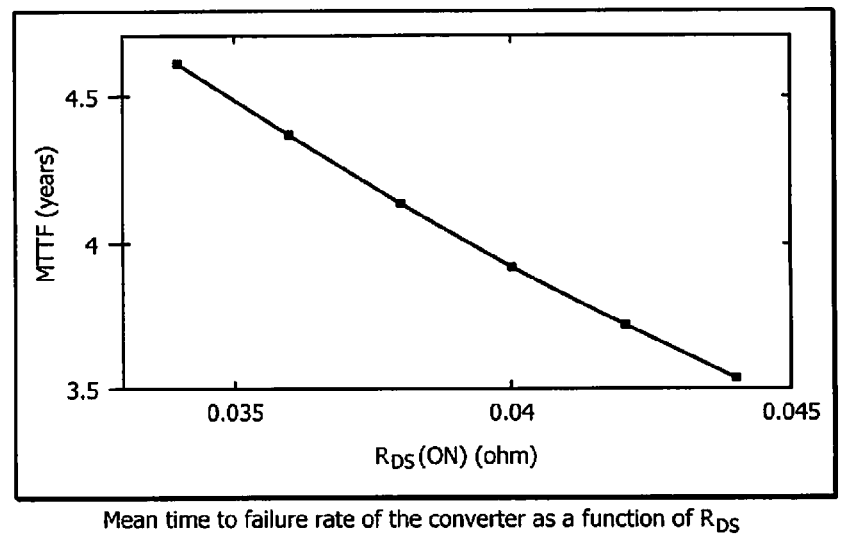

A MATLAB script based on this analysis was performed to estimate the converter's failure rate and MTTF as a function of aging in the MOSFET, and the obtained results have been summarized in FIGS. 12(a)-12(f). Once the converter operates in a closed loop, the power loss associated to the MOSFET will eventually increase, and that has been demonstrated in FIG. 12(a). This additional loss will eventually degrade the operation of the MOSFET resulting in higher $R_{DS}$ (ON). This secondary effect will cause a tertiary effect and it will continue to affect the MOSFET and other components. FIG. 12(d) shows that the MOSFET failure rate will significantly increase as the $R_{DS}$ keeps increasing, and the converter reliability could be expressed as a function of MOSFET $R_{DS}$ shown in FIG. 12(f). The MTTF can vary from 4.6to 3.54 for the variation in $R_{DS}$. The MTTF of the converter would be even lower if we consider aging in other components in the circuit. For simplicity, only the aging associated with the MOSFET has been considered in the MATLAB script. Accordingly, a unified relationship among the various components aging within a power converter may be obtained, and a more accurate MTTF model can be calculated.

As described above, embodiments may be implemented in a photovoltaic (PV) system. Such as system may include a solar panel or an array of solar panels, e.g. distributed in a branch network. In a photovoltaic system, ground-fault is one of the dominant causes for panel failure. Ground-fault establishes an unintentional low-resistance path to the ground or earth. Grounding is generally required for electrical shock and fire hazards protection, electrical surge protection and EMI reduction. Several system failures or burn out in PV systems due to ground-fault have been reported in recent years. Moreover, PV ground-fault current might be below the threshold current amplitude of the system's ground-fault protection and interruption (GFPI) device, and may remain undetected. This phenomenon may render to another ground-fault without interrupting the GFPI and will lead to a severe damage. Embodiments may utilize SSTDR to detect a short-circuit or open-circuit fault in an energized PV system. As with the embodiments described above, such embodiments may propagate a test signal into a PV system and monitor reflection data. The reflection data may then be processed to determine whether a ground fault is present, and in some cases, where the fault is located.

Further, the occurrence of a double ground-fault might be extremely dangerous for a PV system. In such cases, for example, the short circuit current may exceed more than 1,300 A in a 500 kW PV array. Embodiments may further be utilized to monitor and locate double ground fault occurrences.

It is noted that ground-fault detection using SSTDR generally does not depend on the fault current and highly immune to noise signals. Therefore, SSTDR may be used in the absence of the solar irradiation as well. Moreover, it may be used locate the fault in series connected PV modules which may assist in maintaining the modules.

A ground-fault protection and interruption (GFPI) device is generally installed in a PV system to detect the ground-fault, interrupt it, and to provide a fault indication to protect the system from potential fire hazards. Usually ground-fault is detected if the fault current exceeds some predetermines values set by the GFPI devices. A GFPI system based on fault current measurement suffers from limitations. For example, aground-fault may occur in the absence of the solar irradiation (i.e., during night) and remain undetected; ground-fault current may be smaller than the GFPI threshold current limit; GFPI based on differential current measurement may suffer from noise and provide misleading fault indication; and an undetected ground-fault may pose as a "normal condition" and render to another ground-fault (double ground-fault). This may establish a fault current path without being interrupted by GFPI devices.

As shown above, the remaining life of a live component such as a power system including power converters, electric machines and electric wiring may be estimated. Using measurement techniques presented herein, systems are capable of estimating the state of health of individual components in a power system, and converter specific models may be created.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for estimating the state of health of an electronic component located between a plurality of nodes, said method comprising:
   placing the electronic component under test while said electronic component is in a live working condition;
   propagating a test signal into the electronic component, said test signal configured to be non-interfering with the functionality of the electronic component;
   receiving reflections of the propagated test signal from the electronic component at a testing device; and
   processing the reflected signal to determine at least one performance-degradation characteristic of the electronic component based on a predetermined relationship between the performance-degradation characteristic and a matrix of impedances indicative of impedance between each of the plurality of nodes, wherein processing the reflected signal comprises generating the matrix of impedances between the plurality of nodes based on the received reflections.

2. The method of claim 1 wherein the electronic component is a power converter.

3. The method of claim 2 wherein the power converter part of an automobile power system.

4. The method of claim 2 wherein the power converter is part of a power distribution network.

5. The method of claim 1 wherein the electronic component comprises a switching device.

6. The method of claim 5 wherein the performance degradation characteristic is an impedance change within the switching component.

7. The method of claim 1 wherein the performance degradation characteristic is a change in at least one of capacitance and equivalent series resistance of a capacitor.

8. The method of claim 1 wherein the performance degradation characteristic is a change in an inductor.

9. The method of claim 1 wherein the test signal is transmitted using spread spectrum time domain reflectometry.

10. The method of claim 1 wherein the electronic component is one or more components in a photovoltaic system.

11. The method of claim 10 further comprising processing the reflected signal to determine whether a ground fault is present in the photovoltaic system.

12. A system comprising:
a power converter including a plurality of nodes and configured to modify properties of electrical power propagating in the system; and
a state of health testing device configured to transmit a test signal into a power converter while the power converter is functioning within the system, said state of health testing device further configured to monitor reflections from the test signal and process the reflections in order to analyze a performance-degradation characteristic based on a predetermined relationship between the performance-degradation characteristic and a matrix of impedances, the performance-degradation characteristic indicative of effects that occur as a result of degradation of components within the power converter, wherein processing the reflections includes generating the matrix of impedances between the plurality of nodes within the power converter based on the received reflections.

13. The system of claim 12 wherein the system is a high voltage DC power distribution system.

14. The system of claim 12 wherein the system is an automobile power system.

15. The system of claim 12 wherein the component is at least one MOSFET and state of health testing device monitors a drain-to-source resistance ($R_{DS}$) of one or more of the MOSFETs.

16. The system of claim 12 wherein the component is an IGBT and state of health testing device monitors one or more of threshold voltage, transconductance, and collector-emitter ON voltage.

17. The system of claim 12 wherein component is at least one capacitor and state of health testing device monitors changes in one or more of equivalent series resistance and capacitance of the capacitors.

18. The system of claim 12 wherein said system includes a plurality of power converters.

19. The system of claim 18 wherein the plurality of power converters are configured to be monitored by a single state of health testing device.

20. The system of claim 18 wherein the plurality of power converters are configured to be monitored by a plurality of state of health testing devices.

21. The device of claim 12 wherein the performance-degradation characteristic is indicative of degradation of one or more of a group consisting of a MOSFET, capacitor, IGBT, and an inductor.

* * * * *